United States Patent
Akimoto et al.

(10) Patent No.: US 6,629,295 B1
(45) Date of Patent: Sep. 30, 2003

(54) DESIGN AUTOMATION METHOD AND DEVICE

(75) Inventors: Tetsuya Akimoto, Tokyo (JP); Morihisa Hirata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/339,117

(22) Filed: Jun. 24, 1999

(30) Foreign Application Priority Data

Jun. 24, 1998 (JP) .......................................... 10-177368

(51) Int. Cl.[7] .............................................. G06F 17/50
(52) U.S. Cl. ............................... 716/5; 716/4; 716/18
(58) Field of Search .................. 716/1–5, 18; 324/765, 324/769; 703/14–15, 18–19; 714/1, 41, 780

(56) References Cited

U.S. PATENT DOCUMENTS

| | | | | |
|---|---|---|---|---|
| 5,101,491 A | * | 3/1992 | Katzeff | 703/22 |
| 5,208,765 A | * | 5/1993 | Turnbull | 702/84 |
| 5,410,163 A | * | 4/1995 | Murakami | 257/48 |
| 5,625,288 A | * | 4/1997 | Snyder et al. | 324/158.1 |
| 5,684,808 A | * | 11/1997 | Valind | 714/726 |
| 5,787,190 A | * | 7/1998 | Peng et al. | 382/145 |
| 5,822,218 A | * | 10/1998 | Moosa et al. | 716/4 |
| 6,249,137 B1 | * | 6/2001 | Krieger et al. | 324/765 |
| 6,329,831 B1 | * | 12/2001 | Bui et al. | 324/765 |

FOREIGN PATENT DOCUMENTS

| | | |
|---|---|---|
| JP | 03-296171 | 12/1991 |
| JP | 04-199329 | 7/1992 |
| JP | 05-342302 | 12/1993 |
| JP | 05-343522 | 12/1993 |
| JP | 9-292436 | 11/1997 |
| JP | 9-293765 | 11/1997 |
| JP | 9-330344 | 12/1997 |
| JP | 10-124565 | 5/1998 |
| JP | 11-274023 | 10/1999 |

OTHER PUBLICATIONS

Fumiyasu Kato et al., "System LSI Design System OpenCAD V5.2", *NEC Technical Report*, vol. 51, No. 3, Mar. 1988, pp. 109–115.

* cited by examiner

*Primary Examiner*—Matthew Smith
*Assistant Examiner*—Paul Dinh
(74) *Attorney, Agent, or Firm*—Sughrue Mion, PLLC

(57) ABSTRACT

A design automation method is provided which reduces complication of design work resulting from individual verification of a plurality of objects to be verified, for example, electromigration and hot carrier effect. Limiting values are prepared individually for the objects to be verified while a combined limiting value is obtained by combining these limiting values. By the use of the combined limiting value, verification of reliability is performed for all the objects. Specifically, when applied to the electromigration and the hot carrier effect as the objects to be verified, verification can simultaneously be performed upon frequency limiting values for the electromigration and the hot carrier effect.

26 Claims, 2 Drawing Sheets

| FREQUENCY LIMITING VALUE | | LOAD CAPACITANCE | | |
|---|---|---|---|---|
| | | 0.01 | 0.1 | 1.0 |
| WAVEFORM DISTORTION | 0.1 | 500 | 300 | 200 |
| | 1.0 | 400 | 200 | 100 |
| | 10 | 300 | 100 | 50 |

FIG.2

| FREQUENCY LIMITING VALUE | | LOAD CAPACITANCE | | |
|---|---|---|---|---|
| | | 0.01 | 0.1 | 1.0 |
| WAVEFORM DISTORTION | 0.1 | 300 | 250 | 200 |
| | 1.0 | 200 | 150 | 100 |
| | 10 | 100 | 100 | 100 |

FIG.3

| FREQUENCY LIMITING VALUE | | LOAD CAPACITANCE | | |
|---|---|---|---|---|
| | | 0.01 | 0.1 | 1.0 |
| WAVEFORM DISTORTION | 0.1 | 300 | 250 | 200 |
| | 1.0 | 200 | 150 | 100 |
| | 10 | 100 | 100 | 50 |

FIG.4

DESIGN AUTOMATION METHOD AND DEVICE

BACKGROUND OF THE INVENTION

This invention relates to an electronic design automation method and a device therefor and, in particular, to a design automation method of verifying the reliability in a semiconductor integrated circuit and a device therefor.

Generally, a design automation method of the type is widely used in designing and synthesizing a semiconductor integrated circuit and is also used to verify the reliability of the semiconductor integrated circuit from design information of the semiconductor integrated circuit.

In such methods of verifying the reliability of the semiconductor integrated circuit, electromigration of the semiconductor integrated circuit is selected as an object of verification in some instances while hot carrier effect of the semiconductor integrated circuit is selected as an object of verification in some other instances. The electromigration is a phenomenon which occurs when a thin film conductor is supplied with electric current having a high current density. Due to the electromigration, a cavity is produced in a wiring pattern and brings about an open circuit or a short-circuit between patterns. On the other hand, the hot carrier effect is a phenomenon that hot carriers are implanted and captured in an oxide film when a high electric field is applied. Generation of the hot carrier effect results in variation of a threshold voltage of a transistor or deterioration of conductance.

Therefore, the electromigration and the hot carrier effect must strictly be checked and verified upon designing the semiconductor integrated circuit.

As a conventional method which deals with the electromigration as an object of verification and which detects a portion having a potential risk of the electromigration, a verification method is disclosed in Japanese Unexamined Patent Publication (JP-A) No. 9-293765 (hereinafter referred to as Reference 1). In the verification method described in Reference 1, verification is made about whether or not a peak current density of an electric current flowing through a verification object, such as a wire, satisfies a limiting value of the peak current density determined by a design specification against the electromigration.

On the other hand, conventional methods directed to the hot carrier effect as an object of verification are described in Japanese Unexamined Patent Publication (JP-A) No. 9-292436 (hereinafter referred to as Reference 2) and Japanese Unexamined Patent Publication (JP-A) No. 9-330344 (hereinafter referred to as Reference 3). Reference 2 discloses a method of estimating the deterioration of the transistor due to the hot carriers and assuring the reliability about the timing throughout a desired lifespan. On the other hand, Reference 3 discloses a method of calculating an output load of each cell, calculating with reference to the output load thus calculated and reliability information of each cell a transistor life of each cell depending upon the hot carriers, and comparing the life with a reference value to verify the reliability of each cell.

In the present status, verification of the electromigration reference value and verification of the hot carrier effect reference value are separately executed. Specifically, the electromigration reference value is generally given by a limiting value of an electric current flowing through the wire while the hot carrier effect reference value is given by a limiting value of deterioration in a gate oxide film of an N-channel transistor.

The electromigration reference value and the hot carrier effect reference value are related to different objects different from each other and have different values different from each other. Therefore, in the present status, these reference values are converted into limiting value parameters of different formats quite different from each other and are subjected to verification by reliability verifying techniques different from each other.

Accordingly, with the conventional verification methods, the electromigration reference value and the hot carrier effect reference value must be individually verified as two separate steps. Since two verification results are obtained, it is necessary to refer to the two verification results upon feeding back verification errors to a design stage. This results in a complicated design work.

More specifically, design criteria for both factors show limiting values quite different from each other. If a verification error is present in at least one of them, it is necessary to modify the circuit. Thus, twice execution of the reliability verification is a serious disadvantage in the design work.

SUMMARY OF THE INVENTION

It is an object of this invention to provide a design automation method and device capable of verifying the reliability without separately verifying a plurality of verification objects in a plurality of steps.

It is another object of this invention to provide a logical synthesis tool capable of simultaneously verifying a plurality of verification objects.

According to one aspect of this invention, there is provided a design automation method for verifying by the use of a computer the reliability in a circuit represented by a logical level, the method comprising a step of selecting first and second verification factors for verifying the reliability of the circuit, a step of setting first and second limiting values related to the first and the second verification factors, respectively, a step of setting a combined limiting value common to the first and the second verification factors with reference to the first and the second limiting values, and a step of verifying by the use of the combined limiting value the reliability of the circuit represented by the logical level.

According to another aspect of this invention, there is provided a logical synthesis tool for synthesizing by the use of a computer a circuit represented by a logical level, the tool including a table holding first and second limiting values related to predetermined first and second factors, respectively, a table holding a combined limiting value obtained from the first and the second limiting values, and means for verifying and synthesizing by the use of the combined limiting value the circuit represented by a logical level.

According to still another aspect of this invention, there is provided a layout tool for inserting a wire and a buffer, the layout tool including a table storing limiting values related to factors different from one another, a table storing a combined limiting value calculated from the limiting values different from one another, and means for inserting the wire and the buffer with reference to the combined limiting value.

According to a different aspect of this invention, there is provided a recording medium for use in design and verification of a circuit represented by a logical level, the medium including a table related to a plurality of factors used in the design and the verification and means storing a procedure for combining the factors.

BRIEF DESCRIPTION OF THE DRAWING

FIG. 2 is a view showing a frequency limiting table used in FIG. 1 for electromigration;

FIG. 3 is a view showing a frequency limiting table used in FIG. 1 for hot carrier effect; and FIG. 4 is a view showing a frequency limiting table as a combination of FIGS. 2 and 3.

DESCRIPTION OF THE PREFERRED EMBODIMENTS

Figure 1:
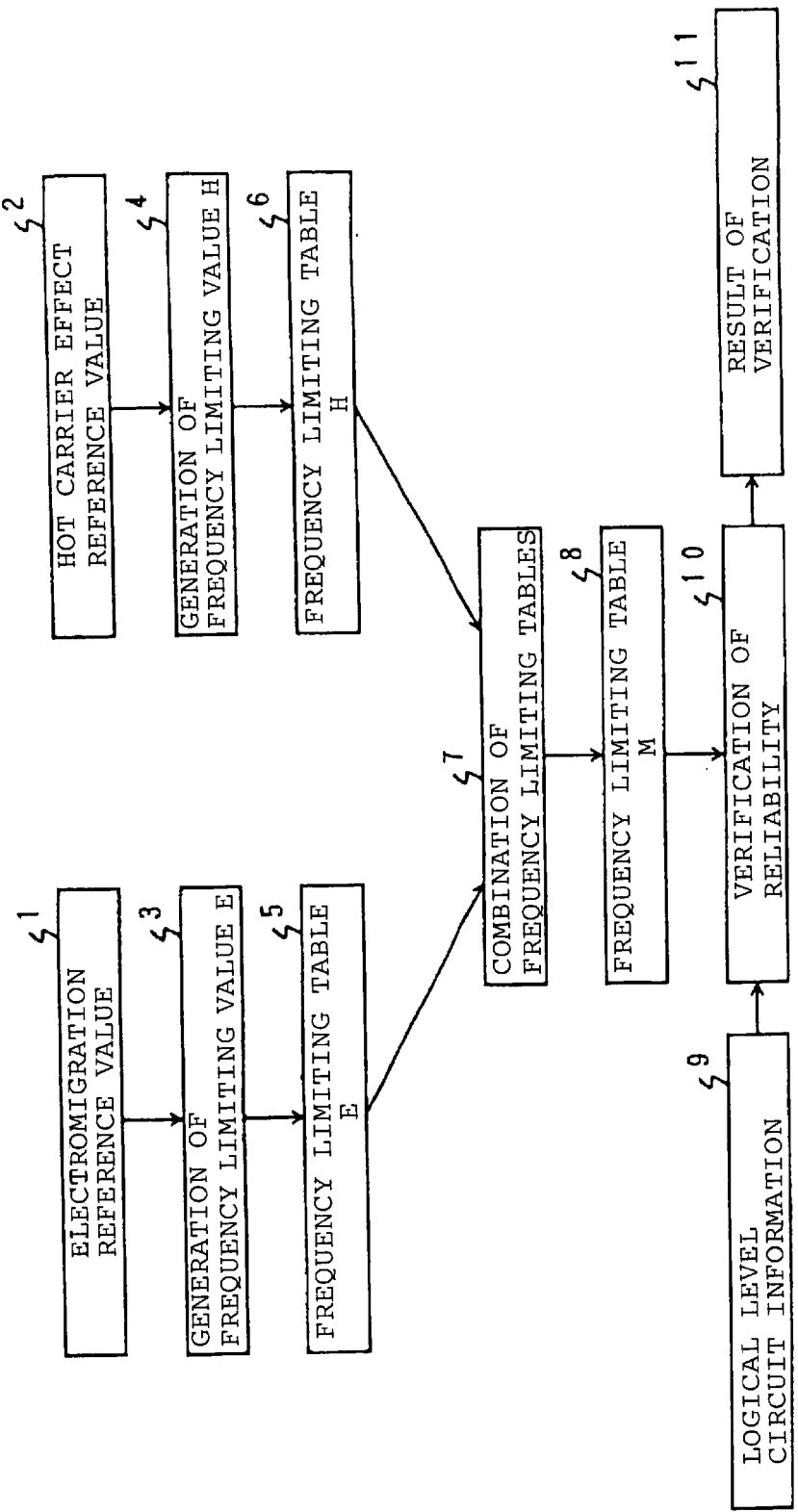
FIG. 1 is a flow chart for describing a design automation method according to one embodiment of this invention.

Now, this invention will be described with reference to the drawing.

Referring to FIG. 1, description will be made about an electronic design automation method, i.e., a verification method according to one embodiment of this invention. At first, it is assumed here that the verification method of this invention is used as a reliability verification tool. The reliability tool according to this invention may be incorporated in the form of a subroutine into a part of a logical synthesis tool. After the logical synthesis tool is incorporated, the verification method of this invention is used to verify results of a logical synthesis by carrying out the logical synthesis from a net list represented by a register transfer level (RTL) level and by thereafter giving various restraints to the logical synthesis. Specifically, in the logical synthesis tool, a report file is prepared with reference to the result with the constraints given thereto. The report file may be used for logical re-synthesis or load adjustment.

Furthermore, the verification method according to this invention is similarly applicable to a DRC (design rule check), a layout tool, or the like. In any event, the method is executed as a subroutine at a part of a series of logical synthesis operations.

In this invention, electromigration and hot carrier effect are selected as verification objects to be given constraints. The electromigration and the hot carrier effect are used in verifying the life of a logically synthesized circuit. Upon verification, it is verified whether or not the logically synthesized circuit deviates from their reference values, i.e., whether or not the life corresponding to these reference values is assured.

Next, in order to facilitate an understanding of this invention, description will be made about the relationship between the electromigration and the hot carrier effect and aging in a device such as a MOS transistor. Aging of the device due to the electromigration and the hot carrier effect appears as deterioration of a frequency characteristic for each load. In addition, the deterioration of the frequency characteristic is determined by a degree of a rounded waveform at a leading or rising edge and a trailing or falling edge of a signal waveform given to the device. In other words, the signal waveform are relaxed at the leading edge and the trailing edge due to aging, resulting in deterioration of the frequency characteristic.

Next, in order to facilitate an understanding of this invention, description will be made about the electromigration and the hot carrier effect. The electromigration is a phenomenon that a wire is deteriorated by an electric current flowing through the wire to be increased in resistance or to be interrupted. The hot carrier effect is a phenomenon that a device such as a MOS transistor is deteriorated by an electric current flowing through the device so that the frequency characteristic is deteriorated. The electric current flowing through the wire or the device is determined by waveform rounding at the leading edge and the trailing edge of the signal waveform given to the device, a load capacitance at an output of the device, and the frequency of input and output signals to and from the device.

For the electromigration and the hot carrier effect described above, an electromigration reference value and a hot carrier effect reference value are determined. These reference values represent limiting values to realize a desired characteristic even after aging. It is noted here that the electromigration reference value depends upon a limiting value of the current value flowing through the wire and is represented by a time function determined by an electric current generated from the electromigration. In this event, the current value determining the electromigration reference value may be an average current density or a peak current density of the electric current flowing through the wire or the like.

In this embodiment, the electromigration reference value is given by calculating the following formula (1) and represents a time duration (t50) before the device becomes defective. Thus, verification is made about whether or not the life of the device as an object is longer than the electromigration reference value.

$$(t50=) A_p J^n e^{Ea/KT} \leq T_{life} \tag{1}$$

In the formula (1), Ap and n represent process-dependent constants, J, a current density (A/m$^2$) of the wire given by J=I/Sa, K, the Boltzmann constant, T, the absolute temperature, I, an electric current (A) of the wire, Sa, a sectional area (m$^2$) of the wire, Ea, activation energy, and $T_{life}$, a life such as 40 years. As is obvious from the formula (1) also, the electromigration reference value depends upon the current density J of the electric current flowing through the wire and is set to a smaller value as the current density J is greater, provided that other conditions are kept constant.

On the other hand, the hot carrier effect reference value is represented by a limiting value of a deterioration level of the gate oxide film in the transistor forming the cell, taking into account that cell delay varies due to deterioration in characteristic resulting from hot carrier implantation into the oxide film of the cell. In this case, the deterioration level of the gate oxide film corresponds to a cell life with respect to the hot carriers.

In the embodiment of this invention, the hot carrier effect reference value is given by the following formula (2).

$$(C\max=) \alpha 1 \times S^{\beta 1} \times W \geq C \tag{2}$$

Herein, S represents a normalization stress, α1 and β1, constants dependent upon the process, the primitive circuit structure, and the waveform rounding, W, the width ($\mu$m) of an N-channel transistor, and C, a load capacitance (pF).

As is obvious from the formula (2) also, the hot carrier effect reference value is represented by a capacitance value corresponding to the size of each transistor and the signal waveform. Verification is made about whether or not the capacitance value (C) of the transistor as an object is smaller than the hot carrier effect reference value. The normalization stress S is given by the following formula (3).

$$S = (1/\tau_\alpha) \times (1/f) \times (\alpha_2) \times (e^{\beta 2 \times T}) \tag{3}$$

Herein, $\tau_\alpha$ represents a constant (time) depending upon the application of the product or the reliability guarantee level, f, an operation frequency (Hz), $\alpha_2$ and $\beta_2$, process-dependent constants, and T, the absolute temperature. As is obvious from the formula (2), the hot carrier effect reference value is defined by the capacitance in this embodiment, as described in the foregoing.

Turning back to FIG. 1, the electromigration reference value and the hot carrier effect reference value are determined in steps 1 and 2, respectively. Then, the step 1 proceeds to a step 3 while the step 2 proceeds to a step 4. For these steps 3 and 4, a circuit represented by a logical level or a circuit information level is divided into a plurality of logical blocks. In the following description, the processing and the data involved in the electromigration are labelled by a symbol E while the processing and the data involved in the hot carrier effect are labelled by a symbol H in order to distinguish the processings involved in the electromigration and the hot carrier effect.

In the step 3 related to the electromigration, a frequency limiting value E for the electromigration is produced. Specifically, reference is made to the electromigration reference value given in the formula (1). By inversely estimating from the ratio given to the reference value calculated when each of the input/output signals takes a standard frequency, calculation is made of the frequency limiting value E satisfying the electromigration reference value. In this event, it is to be noted that the frequency limiting value E is varied in dependency upon the input waveform rounding at the leading edge and the trailing edge of the signal waveform and the output load capacitance. The waveform rounding in this embodiment is represented by a rising time Tr of transition of the input signal from a low level to a high level or a falling time Tf of transition from the high level to the low level. By way of example, an inverter comprising a CMOS will be considered. During the rising or the falling time mentioned above, a transient current flows through any of transistors forming the CMOS. The transient current becomes greater as the above-mentioned time Tr or Tf is longer. As a result, the electromigration reference value may not be satisfied.

Next, consideration will be made about the relationship between the load capacitance Cload and the frequency. When the load capacitance is greater and smaller, the maximum frequency which can be responded is lower and higher, respectively. For example, when the load capacitance Cload is on the order of 0.1 pF, the maximum frequency is about 600 MHz. On the other hand, when the load capacitance Cload is increased to about 1 pF, the maximum frequency is lowered to about 100 MHz.

Considering the relationship between the waveform rounding and the frequency as well as the relationship between the load capacitance Cload and the frequency, the frequency limiting value E at each waveform rounding (nanosecond) and each load capacitance (pF) are calculated and successively stored in the form of a table (hereinafter called a frequency limiting table E) illustrated in FIG. 2 (step 5). As seen from the frequency limiting table E, the frequency limiting value E is small (for example, 50 MHz) when the waveform rounding is great (for example, 10 nanoseconds) and the load capacitance is great (for example, 1.0 pF). On the other hand, the frequency limiting value E is great (for example, 500 MHz) when the waveform rounding is small (for example, 0.1 nanosecond) and the load capacitance is small (for example, 0.01 pF).

On the other hand, in the step 4 related to the hot carrier effect, a frequency limiting value H for the hot carrier effect is produced considering the hot carrier effect reference value obtained by the formula 2, provided that the hot carrier effect reference value represented by the capacitance value is not exceeded. In this case also, the frequency limiting value H is calculated for each waveform rounding and each load capacitance while the operation frequency of each pin is changed, utilizing the relationship between the input waveform rounding of each logical block and the maximum frequency as well as the relationship between the output load capacitance and the maximum frequency.

The frequency limiting value H thus produced also depends upon the waveform rounding and the load capacitance. The relationship among the waveform rounding, the load capacitance, and the frequency limiting value H is tubulated into a table (hereinafter called a frequency limiting table H) as shown in FIG. 3 to be stored in a memory (step 6).

As is obvious from the frequency limiting table H illustrated in FIG. 3, the frequency limiting value H is as small as about 100 MHz when the waveform rounding is great (for example, 10 nanoseconds) and the load capacitance is great (for example, 1.0 pF), like the frequency limiting value E. On the other hand, this value is as great as 300 MHz when the waveform rounding is small (for example, 0.1 nanosecond) and the load capacitance is small (for example, 0.01 pF).

Comparing FIGS. 2 and 3, both of the frequency limiting values E and H are calculated with the waveform rounding and the load capacitance fixed to specific values. In addition, ranges of variation in waveform rounding and in load capacitance are common to both of the frequency limiting tables E and H. However, it is seen that the frequency limiting values E and H determined by the waveform rounding and the load capacitance are different in these tables.

It will readily be understood that, if more strict values, i.e., smaller values are selected from the frequency limiting values E and H given in the frequency tables E and H, those values can be used as frequency limiting values satisfying both conditions of the electromigration and the hot carrier effect.

Taking the above into consideration, in the embodiment illustrated in FIG. 1, the frequency limiting tables E and H are combined as shown in a step 7 to prepare a combined frequency limiting table M illustrated in FIG. 4 (step 8). Specifically, by selecting the smaller ones of the frequency limiting values given in the frequency limiting tables E and H, the combined frequency limiting table M is prepared. In detail, for the waveform rounding (10 nanoseconds) and the load capacitance (1.0 pF), the frequency limiting value of 50 MHz in the frequency limiting table E is selected. For the waveform rounding (10 nanoseconds) and the load capacitance (0.01 pF), the frequency limiting value (100 MHz) in the frequency limiting table H is selected. Similarly, for the waveform rounding (1.0 nanoseconds) and the load capacitances (0.1 pF) and (0.01 pF), the frequency limiting values (150 MHz) and (200 MHz) in the frequency limiting table H are selected as values in the combined frequency limiting table M, respectively.

With reference to the combined frequency limiting table M obtained in the step 8, verification of the reliability in each logical block is carried out in subsequent steps.

Upon the above-mentioned verification, circuit information at a logical level is taken from the memory for each logical block or each net (step 9). Herein, the circuit information represents a logical circuit by connections among transistors, resistors, and capacitances in a semiconductor integrated circuit to be verified as well as model parameters.

Next, from the input waveform rounding and the output load capacitance in each logical block, the frequency limiting value is calculated with reference to the combined frequency limiting table M obtained in the step 8. Verification is made in a step 10 about whether or not an actual frequency obtained by simulation or the like satisfies the above-mentioned frequency limiting value. The result of verification in the step 10 is outputted in a step 11.

The verification step in the step 10 will be described more in detail. In the verification step 10, verification is carried out about whether or not the frequency in each logical block with the waveform rounding and the load capacitance determined exceeds the frequency limiting value given in the frequency limiting table M. If the frequency limiting value is exceeded as a result of verification, it is judged that the circuit information of the logical block in consideration satisfies the conditions for the electromigration and the hot carrier effect. On the other hand, if the frequency limiting value is not exceeded, preparation is made of a report file for the logical block in consideration and logical synthesis is carried out again.

Hereinafter, description will be made more in detail about the electromigration limiting value and the hot carrier effect limiting value used in the foregoing embodiment.

At first, the electromigration limiting value is calculated with reference to a limiting value (Imax) of a current value of a wire. The current value (I) flowing through the logical block and the external wire varies in dependence upon the input waveform rounding (Trf), the output load capacitance (Cload), and the operation frequency (Freq) of each pin of the logical block. The limiting value of the current value is represented by a function Fe of the formula (4) related to the electromigration by the use of the input waveform rounding (Trf), the output load capacitance (Cload), and the operation frequency (Freq).

$$Imax > I = Fe(Trf, Cload, Freq) \qquad (4)$$

In practice, calculation is made of the limiting value of the current value with respect to each input waveform rounding, each load capacitance, and each frequency in accordance with the formula (4). Subsequently, calculation is made of an upper limit frequency satisfying the limiting value of the current value. The upper limit frequency thus calculated is obtained for each pin of each logical block and for each waveform rounding and each load capacitance. As illustrated in FIG. 2, these values are described as frequency limiting values on a two-dimensional table of the input waveform rounding and the output load capacitance. Although the two-dimensional table is shown in FIG. 2, use may be made of a one-dimensional table representative of the relationship between the waveform rounding (Trf) and the maximum frequency or a one dimensional table representative of the relationship between the load capacitance and the maximum frequency. As the specific function Fe in the formula (4) related to the electromigration, various formulas can be used.

On the other hand, the frequency limiting value representative of the hot carrier effect can be calculated, for example, from the deterioration level of the gate oxide film of the above-mentioned N-channel transistor. Generally, the deterioration level of the gate oxide film is used after conversion into another limiting value by various approximations. Herein, use is made of an approach of approximating the deterioration level from an accumulated time required for a gate voltage to reach a VDD-GND intermediate potential and the drain current (Idrain). In this event, the deterioration level for the hot carriers is represented by the following formula 5 by the use of the function Fh for calculation of reference stress S.

$$Smax > S = Fh(Tmid, Idrain) \qquad (5)$$

Specifically, Fh' can be calculated by dividing by the frequency the ratio of a stress time due to an a.c. bias and a stress time due to a d.c. bias.

The accumulated time (Tmid) can be represented by the waveform rounding (Tr) and the frequency (Freq) while the drain current (Idrain) can be represented by the waveform rounding (Trf), the load capacitance (Cload), and the frequency. Therefore, the formula (5) can be rewritten into the formula (6).

$$Smax > S = Fh'(Trf, Cload, Freq) \qquad (6)$$

In any event, by the use of the formula (6), the frequency limiting value satisfying each reference stress S can be obtained from the limiting value of the reference stress S calculated for each waveform rounding Trf calculated, each load capacitance Cload, and each frequency Freq.

Accordingly, as regards the hot carrier effect, calculation is made of the limiting value of the deterioration level of the gate oxide film. In addition, for each pin of each logical block, the frequency limiting value with respect to the input waveform rounding and the output load capacitance can be obtained in the form of a one-dimensional or a two-dimensional table.

Furthermore, when the frequency limiting table of the electromigration and the frequency limiting table of the hot carrier effect are combined so that the worst values (minimum values) in these tables are selected, the frequency limiting table for simultaneously verifying the reliability for both of the factors can be prepared.

In the foregoing embodiment, the hot carriers to be verified are practically hot electrons because the description is directed to the N-channel transistor by way of example. In case of the P-channel transistor, the hot carriers are hot holes, as will readily be understood. Therefore, if the transistors of the both channels coexist, it is necessary to prepare tables for both of them.

The design automation method according to this invention is applicable not only to the reliability verification tool as described above but also to a logical synthesis tool. In addition, this method may be used as a subroutine in a layout tool for inserting a wire and a buffer with reference to the verification result of simultaneous verification of the electromigration and the hot carrier effect according to this invention. Furthermore, the verification method of this invention of simultaneously verifying the electromigration and the hot carrier effect may be incorporated into a DRC (design rule check) flow or a logical synthesis tool.

As described above, according to this invention, the frequency limiting table E is generated from the electromigration reference values while the frequency limiting table H is generated from the hot carrier effect reference values. The frequency limiting table M is produced as a combination of these two frequency tables by selecting minimum values. By the use of the frequency limiting table M thus obtained, verification of reliability of the logical level circuit can be performed. In addition, the procedure of processing the above-mentioned tables and the data in the tables and verifying the reliability may be stored in a recording medium.

In the foregoing embodiment, description has been directed exclusively to the electromigration and the hot carriers having the frequency limiting values as common limiting values. However, this invention is similarly applicable to any verification objects having common limiting values and common factors determining the limiting values. The number of the objects to be verified is not restricted to two and this invention is similarly applicable to simultaneous verification of a greater number of objects.

In this invention, preparation is preliminarily made of the frequency limiting table M combining the frequency limiting table E obtained from the electromigration reference values and the frequency limiting table H obtained from the hot carrier effect reference values. It is consequently possible to simultaneously verify the reference values of both the electromigration and the hot carrier effect for the logical level circuit. Thus, according to this invention, verification time can be shortened because a plurality of objects can be simultaneously verified. Since the single verification method is used, the verification result is simplified. Furthermore, feedback of the verification result to a design stage is easy.

What is claimed is:

1. A design automation method for verifying by the use of a computer the reliability in a circuit represented by a logical level, said method comprising:

a step of selecting first and second verification factors for verifying the reliability of said circuit;

a step of setting first and second limiting values related to said first and said second verification factors, respectively;

a step of setting a combined limiting value common to said first and said second verification factors with reference to said first and said second limiting values; and a step of verifying by the use of said combined limiting value the reliability of said circuit represented by said logical level.

2. A design automation method as claimed in claim 1, wherein said first and said second verification factors are electromigration and hot carrier effect, respectively.

3. A design automation method as claimed in claim 2, wherein said first and said second limiting values are an electromigration limiting value and a hot carrier effect limiting value, respectively.

4. A design automation method as claimed in claim 3, wherein said first limiting value is composed of first and second frequency limiting values calculated for the electromigration and the hot carrier effect, respectively.

5. A design automation method as claimed in claim 4, wherein said first and said second frequency limiting values depend upon input waveform rounding and an output load capacitance.

6. A design automation method as claimed in claim 5, wherein said step of verifying the reliability of said circuit includes a step of simultaneously verifying the electromigration and the hot carrier effect with reference to said combined limiting value.

7. A design automation method as claimed in claim 1, wherein said combined limiting value is a limiting value representative of a more strict condition among said limiting values.

8. A design automation method as claimed in claim 1, said method further comprising a step of calculating reference values for said first and said second verification factors, said first and said second limiting values being calculated under limitation by said reference values.

9. A design automation method as claimed in claim 8, wherein said first and said second verification factors are electromigration and hot carrier effect, respectively, reference values for the electromigration and the hot carrier effect being represented by predetermined first and second formulas.

10. A design automation method as claimed in claim 9, wherein said first formula for the electromigration is given by the following formula (1) related to a life (t50) as a reference:

$$(t50=)A_p J^n e^{Ea/KT} \leq T_{life} \qquad (1)$$

wherein in the formula (1) Ap and n are process-constants, J, a current density (A/m$^2$) of a wire given by J=I/Sa, K, the Boltzmann constant, T, the absolute temperature, I, an electric current (A) of a wire, Sa, a sectional area (m$^2$) of the wire, Ea, activation energy, and $T_{life}$, the life.

11. A design automation method as claimed in claim 9, wherein said second formula for the hot carrier effect is given by the following formula (2) related to a maximum capacitance Cmax:

$$(Cmax=)\alpha 1 \times S^{\beta 1} \times W \geq C \qquad (2)$$

wherein S represents a reference stress, α1 and β1 being constants dependent upon a process, a primitive circuit structure, and waveform rounding, and W, the width (μm) of an N-channel transistor, the reference stress S being represented by the following formula (3):

$$S=(1/\tau_\alpha) \times (1/f) \times (\alpha_2) \times (e^{\beta 2 \times T}) \qquad (3)$$

wherein $\tau_\alpha$ represents a constant (time) dependent upon the application of a product or a reliability guarantee level, f, an operation frequency (Hz), $\alpha_2$ and $\beta_2$, process-dependent constants, and T, the absolute temperature.

12. A design automation method as claimed in claim 11, wherein said first and said second limiting values are determined for each waveform rounding.

13. A design automation method as claimed in claim 12, wherein said first and said second limiting values are frequency limiting values determined for a combination of the waveform rounding and the load capacitance.

14. A computer-readable medium having computer-executable instructions to cause a computer to perform a method comprising:

selecting first and second verification factors for verifying the reliability of a circuit;

setting first and second limiting values related to said first and said second verification factors, respectively;

setting a combined limiting value common to said first and said second verification factors with reference to said first and said second limiting values; and verifying by the use of said combined limiting value the reliability of said circuit.

15. A computer-readable medium having computer-executable instructions as claimed in claim 14, wherein said first and said second verification factors are electromigration and hot carrier effect, respectively.

16. A computer-readable medium having computer-executable instructions as claimed in claim 15, wherein said first and said second limiting values are an electromigration limiting value and a hot carrier effect limiting value, respectively.

17. A computer-readable medium having computer-executable instructions as claimed in claim 16, wherein said first limiting value is composed of first and second frequency limiting values calculated for the electromigration and the hot carrier effect, respectively.

18. A computer-readable medium having computer-executable instructions as claimed in claim 17, wherein said first and said second frequency limiting values depend upon input waveform rounding and an output load capacitance.

19. A computer-readable medium having computer-executable instructions as claimed in claim 18, wherein verifying the reliability of said circuit includes simultaneously verifying the electromigration and the hot carrier effect with reference to said combined limiting value.

20. A computer-readable medium having computer-executable instructions as claimed in claim 19, wherein said combined limiting value is a limiting value representative of a more strict condition among said limiting values.

21. A computer-readable medium having computer-executable instructions as claimed in claim 14, further comprising calculating reference values for said first and said second verification factors, said first and said second limiting values being calculated under limitation by said reference values.

22. A computer-readable medium having computer-executable instructions as claimed in claim 21, wherein said first and said second verification factors are electromigration and hot carrier effect, respectively, reference values for the electromigration and the hot carrier effect being represented by predetermined first and second formulas.

23. A computer-readable medium having computer-executable instructions as claimed in claim 22, wherein said first formula for the electromigration is given by the following formula (1) related to a life (t50) as a reference:

$$(t50=)A_p J^n e^{Ea/KT} \leq T_{life} \tag{1}$$

wherein in the formula (1) Ap and n are process-constants, J, a current density (A/m$^2$) of a wire given by J=I/Sa, K, the Boltzmann constant, T, the absolute temperature, I, an electric current (A) of a wire, Sa, a sectional area (in$^2$) of the wire, Ea, activation energy, and $T_{life}$, the life.

24. A computer-readable medium having computer-executable instructions as claimed in claim 22, wherein said second formula for the hot carrier effect is given by the following formula (2) related to a maximum capacitance Cmax:

$$(Cmax=)\alpha 1 \times S/^{\beta 1} \times W \geq C \tag{2}$$

wherein S represents a reference stress, α1 and β1 being constants dependent upon a process, a primitive circuit structure, and waveform rounding, and W, the width (μm) of an N-channel transistor, the reference stress S being represented by the following formula (3):

$$S=(1/\tau_\alpha)\times(1/f)\times(\alpha_2)\times(e^{\beta 2 \times T}) \tag{3}$$

wherein $\tau_\alpha$ represents a constant (time) dependent upon the application of a product or a reliability guarantee level, f, an operation frequency (Hz), $\alpha_2$ and $\beta_2$, process-dependent constants, and T, the absolute temperature.

25. A computer-readable medium having computer-executable instructions as claimed in claim 24, wherein said first and said second limiting values are determined for each waveform rounding.

26. A computer-readable medium having computer-executable instructions as claimed in claim 25, wherein said first and said second limiting values are frequency limiting values determined for a combination of the waveform rounding and the load capacitance.

* * * * *